United States Patent
Haga et al.

(10) Patent No.: US 8,421,737 B2
(45) Date of Patent: Apr. 16, 2013

(54) SCANNING LINE DRIVING CIRCUIT, DISPLAY DEVICE, AND SCANNING LINE DRIVING METHOD

(75) Inventors: Hiroshi Haga, Kanagawa (JP); Yoichi Kitagishi, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 272 days.

(21) Appl. No.: 12/759,876

(22) Filed: Apr. 14, 2010

(65) Prior Publication Data

US 2010/0259535 A1  Oct. 14, 2010

(30) Foreign Application Priority Data

Apr. 14, 2009 (JP) ................. 2009-098240
Mar. 11, 2010 (JP) ................. 2010-054379

(51) Int. Cl.
*G09G 3/36* (2006.01)
(52) U.S. Cl.
USPC .......................................... 345/100; 345/204
(58) Field of Classification Search .................. 345/100, 345/98, 204
See application file for complete search history.

(56) References Cited

U.S. PATENT DOCUMENTS

| | | | | |
|---|---|---|---|---|
| 7,420,536 B2 * | 9/2008 | Jang et al. | | 345/100 |
| 8,040,293 B2 * | 10/2011 | Jeong | | 345/46 |
| 2004/0140839 A1 * | 7/2004 | Nagao et al. | | 327/291 |
| 2007/0080921 A1 * | 4/2007 | Wang et al. | | 345/100 |

FOREIGN PATENT DOCUMENTS

| | | |
|---|---|---|
| JP | 2004-226429 | 8/2004 |
| JP | 2006-011024 | 1/2006 |

* cited by examiner

*Primary Examiner* — Chanh Nguyen
*Assistant Examiner* — Roy Rabindranath
(74) *Attorney, Agent, or Firm* — Young & Thompson

(57) ABSTRACT

A scanning line driving circuit includes a first transistor having a source electrode connected to a power supply and a drain electrode to a scanning line and a second transistor having a source electrode connected to the scanning line and a drain electrode connected to a clock signal line. The conductivity type of the second transistor is identical to that of the first transistor. A bias can be supplied, so that the first and second transistors are caused to be in an off-state simultaneously.

8 Claims, 17 Drawing Sheets

FIG. 5

|  | WHEN PULSE IS OUTPUTTED (DURING LOW OUTPUT) | WHEN PULSE IS NOT OUTPUTTED (DURING HIGH OUTPUT) | FLOATING STATE |
|---|---|---|---|
| N1 | LOW (EQUAL TO OR LESS THAN VSS) | High | High |
| N2 | High | Low | Low |
| N3 | High | Low | High |

SCANNING LINE DRIVING CIRCUIT, DISPLAY DEVICE, AND SCANNING LINE DRIVING METHOD

TECHNICAL FIELD

Cross-Reference to Related Application

This application is based upon and claims the benefit of the priority of Japanese patent applications No. 2009-098240 filed on Apr. 14, 2009 and No. 2010-054379 filed on Mar. 11, 2010, the disclosure of which is incorporated herein in its entirety by reference thereto. The present invention relates to a scanning line driving circuit, a display device, and a scanning line driving method, and in particular, to a technique for causing scanning lines of a display device to be in a floating state for a certain period.

BACKGROUND

In recent years, system-on-glass liquid crystal displays are commercially available. These system-on-glass liquid crystal displays have an insulating substrate such as a glass substrate, and driving circuits formed by low-temperature polysilicon thin film transistors (TFTs) and the like are integrated on the insulating substrate. Based on a display with such structure, since driving circuits are directly formed on a glass substrate, the number of external driving ICs can be reduced or the need for such driving ICs can be eliminated. Thus, it is possible to reduce costs, compared with a display on which driving ICs are mounted by a chip-on glass (COG) technique or the like. Generally, such driving circuits formed on the glass substrate of a display are complementary metal oxide semiconductor (CMOS) circuits formed by combining P- and N-channel TFTs.

However, in order to reduce manufacturing costs of such system-on-glass liquid crystal display, it is preferable that driving circuits integrated on the glass substrate be formed by TFTs of a single channel (either N- or P-channel TFTs). Namely, by forming driving circuits with TFTs of a single channel, the number of the manufacturing processes can be reduced, and processes relating to channel characteristics can be reduced by about half, whereby costs can be reduced. For example, Patent Document 1 discloses such single-channel driving circuits.

Further, for a liquid crystal display to be capable of suppressing a driving frequency or changing the scanning direction from top to bottom or bottom to top, the scanning line driving circuits of the display need to have a function of causing scanning lines to be in a floating state. FIG. 3 of Patent Document 2 illustrates an example of the method for causing scanning lines to be in a floating state by using a CMOS circuit. Patent Document 2 uses transmission gates to separate a scanning line and to cause the scanning line to be in a floating state.

Patent Document 1: Japanese Patent Laid-Open No. 2004-226429 (FIG. 1, and the like)
Patent Document 2: Japanese Patent Laid-Open No. 2006-011024 (Table 1, FIG. 2, FIG. 3, and the like)

SUMMARY

The above Patent Documents are incorporated herein by reference thereto. The analysis set forth below is given by the present invention.

However, Patent Document 1 does not disclose a technique for causing scanning lines to be in a floating state. While Patent Document 2 discloses a method for causing scanning lines to be in a floating state, this document does not disclose a method for causing scanning lines to be in a floating state by using a single-channel circuit configuration.

To cause scanning lines to be in a floating state by using a single-channel circuit, one conceivable way is to simply separate the scanning lines by using single-channel switching TFTs, as disclosed in Patent Document 2. However, the present inventor found that this method has the following problems.

Namely, driving capability is decreased, and the rise or fall of an output pulse from a scanning line driving circuit is delayed. This is because, if switching TFTs are arranged on a scanning line, on-resistance of these switching TFTs is added. Further, if the rise or fall of an output pulse is delayed, as a result, contrast of a liquid crystal display is decreased. This is because, since the rise or fall of an output pulse from a scanning line driving circuit is delayed, the on-time of a pixel TFT is shortened and a voltage applied to liquid crystal is decreased.

Thus, it is an object of the present disclosure to provide: a scanning line driving circuit having a single-channel circuit configuration (i.e., configured with transistors of the same conductivity type), capable of causing scanning lines to be in a floating state, and outputting pulses with improved rise and fall characteristics; and a display device and a scanning line driving method using the scanning line driving circuit.

According to one aspect of the present disclosure, there is provided a scanning line driving circuit comprising: a first transistor having a source electrode connected to a power supply and a drain electrode to a scanning line; and a second transistor having a source electrode connected to the scanning line and a drain electrode to a clock signal line and having a conductivity type identical to that of the first transistor. The scanning line driving circuit is configured to be capable of supplying a bias so that the first and second transistors can be caused in an off-state simultaneously.

The meritorious effects of the present disclosure are summarized as follows. According to the present disclosure, a scanning line driving circuit is formed by transistors of an identical conductivity type, capable of causing scanning lines to be in a floating state, and capable of shortening the rise time and the fall time of an output pulse.

BRIEF DESCRIPTIONS OF THE DRAWINGS

FIG. 5 illustrates voltage levels at some parts of the scanning line driving circuit according to the first example of the present disclosure.

PREFERRED MODES

Figure 1:
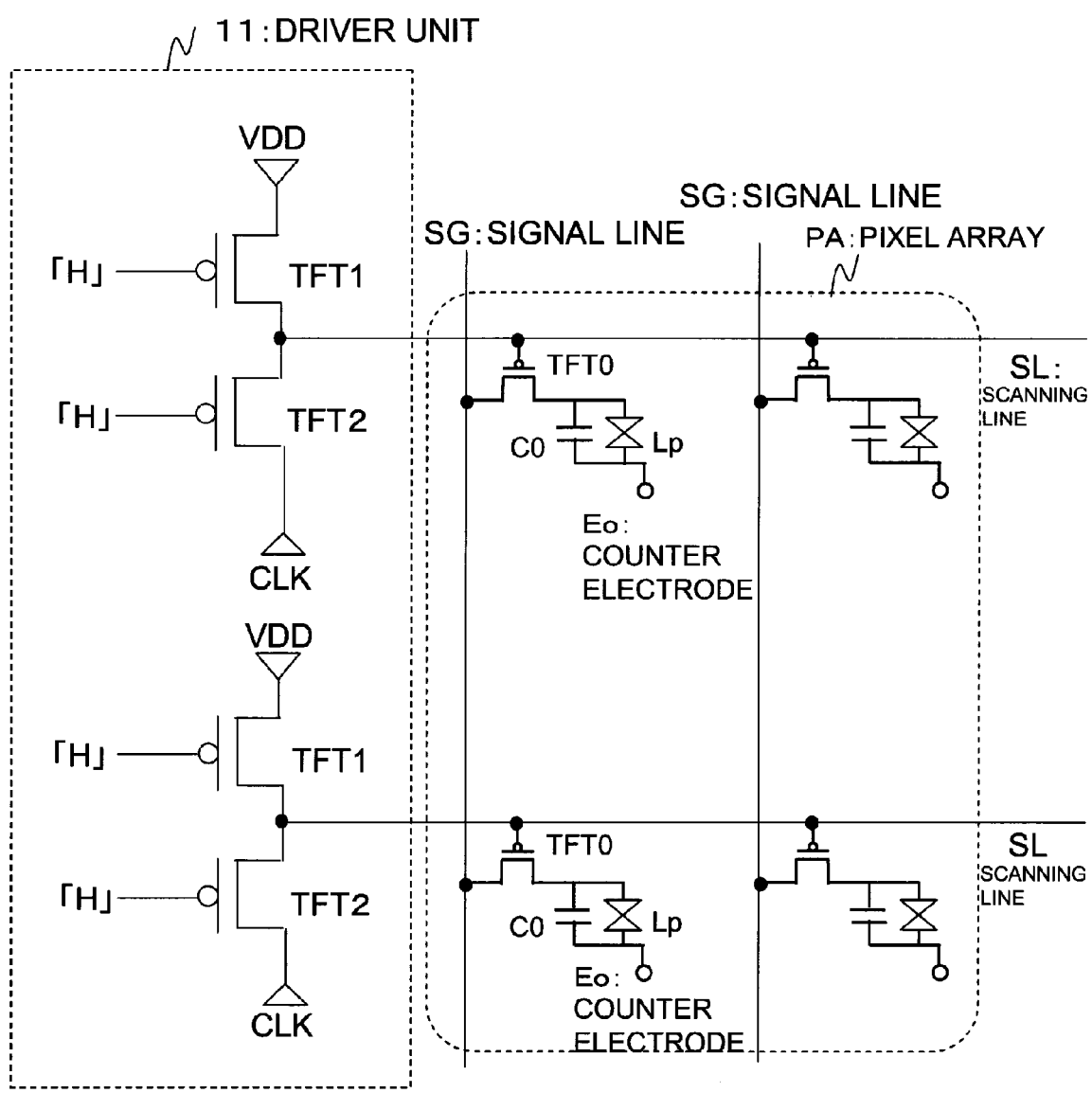
FIG. 1 illustrates circuit diagrams of main parts of a scanning line driving circuit according to an exemplary embodiment of the present disclosure.

According to the present disclosure, various modes are possible, which included, however, not limitative as follows.

Mode 1: As mentioned in the one aspect.

Mode 2: The scanning line driving circuit according to Mode 1 may further comprise: a third transistor having both drain and gate electrodes connected to a gate electrode of the first transistor and a source electrode supplied with a driving signal of the first transistor; and a fourth transistor having a source electrode connected to the gate electrode of the first transistor, a gate electrode connected to the source electrode of the third transistor, and a drain electrode connected to an external control signal line used for causing the scanning line in a floating state, wherein the first to fourth transistors are of the identical conductivity type, and wherein the gate electrode of the first transistor, a gate electrode of the second transistor, and the clock signal line are supplied with signals necessary for shift operation to function as a shift resistor.

Mode 3: The scanning line driving circuit according to Mode 2 may further comprise a fifth transistor having a conductivity type identical to that of the first to fourth transistors and having a drain electrode connected to the gate electrode of the first transistor, a gate electrode connected to the gate electrode of the second transistor, and a source electrode connected to the power supply.

Mode 4: The scanning line driving circuit according to Mode 3 may further comprise a sixth transistor having a conductivity type identical to that of the first to fourth transistors and having a drain electrode connected to the gate electrode of the second transistor, a gate electrode connected to a power supply different from the power supply, and a source electrode connected to the gate electrode of the fifth transistor, wherein the gate electrode of the fifth transistor is connected to the gate electrode of the second transistor via the sixth transistor.

Mode 5: A display device may comprise the scanning line driving circuit according to any one of Modes 1 to 4.

Mode 6: A display device may comprise a pair of the scanning line driving circuits according to any one of Modes 1 to 4 connected to the scanning line.

Mode 7: In the display device according to Mode 6, the pair of the scanning line driving circuits may be arranged to sandwich a display area in which the scanning line is arranged, and the external control signal line in one of the pair of the scanning line driving circuits is activated.

Mode 8: In the display device according to Mode 7, a scanning direction may be inverted by controlling the external control signal line.

Mode 9: In the scanning line driving circuit according to any one of Modes 1 to 4, bias may be applied so that the first and second transistors are simultaneously caused to be in an off-state.

Mode 10: The scanning line driving circuit according to any one of preceding Modes may further comprise: a diode having one end connected to a gate electrode of the first transistor and the other end supplied with a driving signal of the first transistor; and a voltage control switch circuit having one end connected to the gate electrode of the first transistor, a control terminal connected to the other end of the diode, and the other end connected to an external control signal line used for causing the scanning line in a floating state; wherein, when the first transistor is a P-type transistor, one end of the diode is a cathode and the other end is an anode, and when the first transistor is an N-type transistor, one end of the diode is an anode and the other end is a cathode; wherein the voltage control switch circuit comprises a transistor of a conductivity type identical to that of the first transistor; and wherein the gate electrode of the first transistor, a gate electrode of the second transistor, and the clock signal line are supplied with signals necessary for a shift operation to function as a shift resistor.

Mode 11: In the scanning line driving circuit according to Mode 10, the diode may be formed by diode-connecting a third transistor of a conductivity type identical to that of the first transistor.

Mode 12: In the scanning line driving circuit according to any one of preceding Modes, when a signal level of the clock signal line changes, a gate electrode of the second transistor may be controlled to be in a floating state.

FIG. 1 illustrates a circuit diagram of main part of a scanning line driving circuit according to an exemplary embodiment of the present disclosure. The scanning line driving circuit includes a driver unit 11 including: a first transistor TFT1 having a source electrode connected to a power supply VDD and a drain electrode to a scanning line SL; and a second transistor TFT2 having a source electrode connected to the scanning line SL and a drain electrode to a clock signal line CLK. The conductivity type of the second transistor TFT2 is identical to that of the first transistor TFT1. Further, the first and second transistors TFT1 and TFT2 can be supplied with a bias, so that the first and second transistors TFT1 and TFT2 are simultaneously caused to be in an off-state. Herein, both the first and second transistors TFT1 and TFT2 are P-channel TFTs, and when the gate electrodes thereof are supplied with a high-level voltage (H), the first and second transistors TFT1 and TFT2 are caused to be in an off-state. Thus, since the transistors TFT1 and TFT2 are caused to be in an off-state, the scanning line SL is caused to be in a floating state.

In FIG. 1, each pixel included in a pixel array PA includes a switching transistor TFT0, a liquid crystal element (liquid crystal element capacitor) Lp, and a storage capacitor C0. The switching transistor TFT0 has a gate electrode connected to the scanning line SL, a source or drain electrode to a signal line SG, and the other electrode to one end of the liquid crystal element capacitor Lp and the storage capacitor C0. The other ends of the liquid crystal element capacitor Lp and the storage capacitor C0 are connected to a counter electrode Eo.

When a pixel is driven, the transistor TFT1 is turned off, the transistor TFT2 is turned on, and the clock signal line CLK is caused to be at a low level (L). In this way, the scanning line SL is caused to be at a low level. Thus, the switching transistor TFT0 is turned on, and the signal line SG supplies a signal to the liquid crystal element capacitor Lp.

Further, based on the above scanning line driving circuit, modifications as below can be made.

The scanning line driving circuit may further include: a third transistor having both drain and gate electrodes connected to the gate electrode of the first transistor and a source electrode supplied with a driving signal for the first transistor; and a fourth transistor having a source electrode connected to the gate electrode of the first transistor, a gate electrode to the source electrode of the third transistor, and a drain electrode to an external control signal line used for causing the scanning line in a floating state. Further, the first to fourth transistors may be of an identical conductivity type, and the gate electrode of the first transistor, the gate electrode of the second transistor, and the clock signal line may be supplied with signals necessary for a shift operation to function as a shift resistor (11a in FIG. 2).

Figure 6:
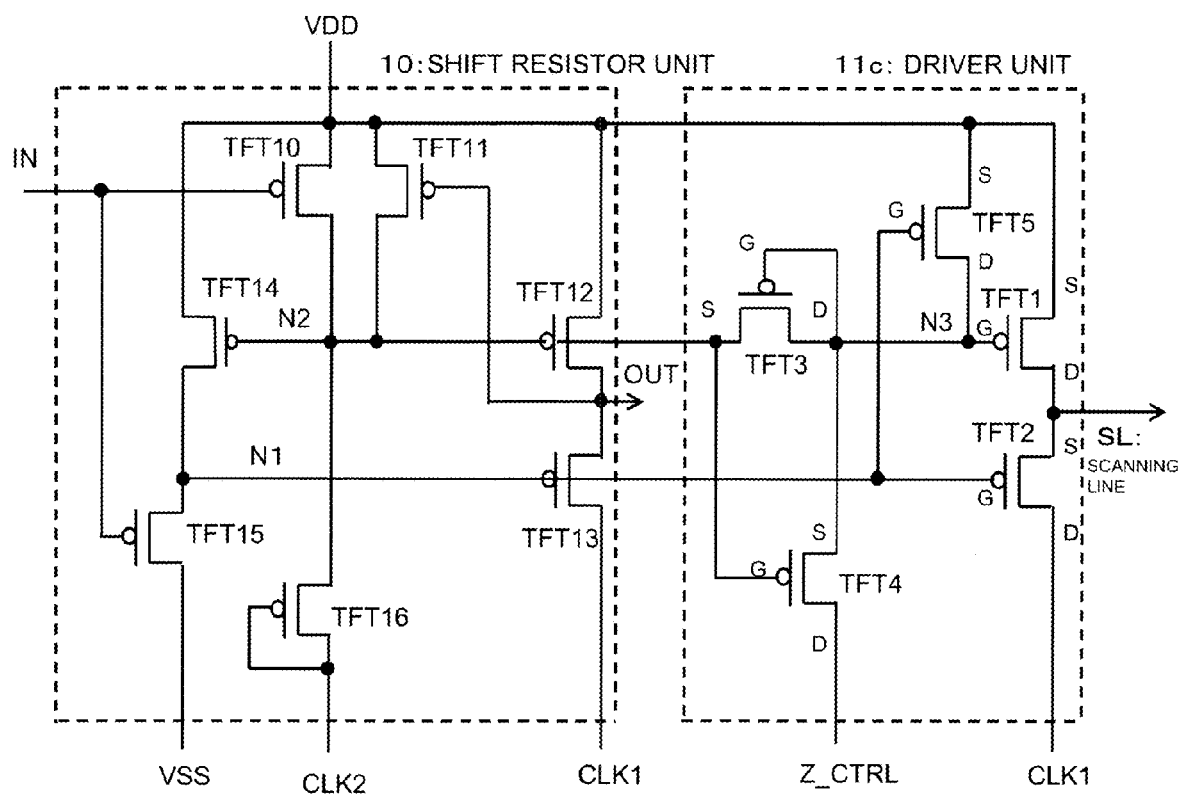
FIG. 6 is a circuit diagram of a scanning line driving circuit according to a second example of the present disclosure.

The scanning line driving circuit may further include a fifth transistor having a conductivity type identical to that of the first to fourth transistors and having a drain electrode connected to the gate electrode of the first transistor, a gate electrode to the gate electrode of the second transistor, and a source electrode to the power supply (for instance, 11c in FIG. 6).

The scanning line driving circuit may further include a sixth transistor having a conductivity type identical to that of the first to fourth transistors and having a drain electrode connected to the gate electrode of the second transistor, a gate electrode to a power supply different from the power supply, and a source electrode to the gate electrode of the fifth transistor. Further, the gate electrode of the fifth transistor may be connected to the gate electrode of the second transistor via the sixth transistor (for instance, 11d in FIG. 8).

A display device may include any one of the scanning line driving circuits as described above.

A display device may include a pair of the scanning line driving circuits connected to a single scanning line.

The display device may include the pair of the scanning line driving circuits arranged to sandwich a display area in which the scanning line(s) is arranged, and the external control signal line in one of the pair of the scanning line driving circuits may be activated.

Examples will be hereinafter described in detail.

EXAMPLE 1

Figure 2:
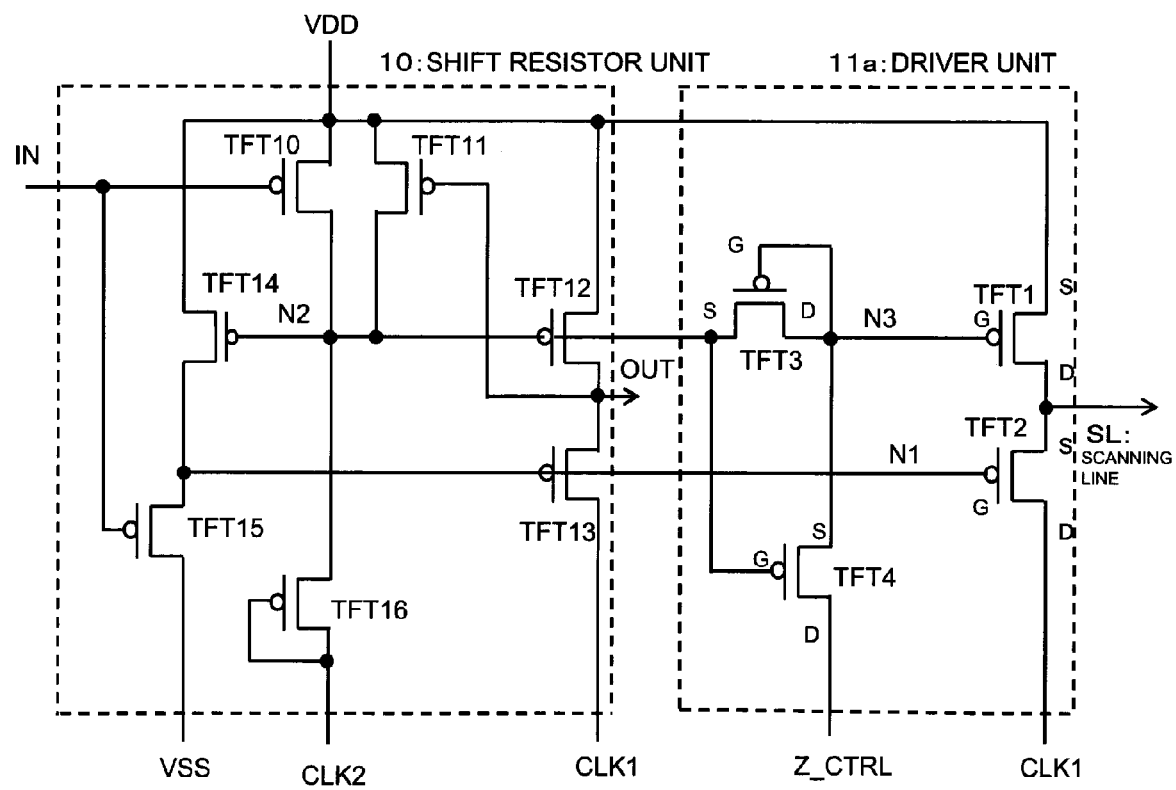
FIG. 2 is a circuit diagram of a scanning line driving circuit according to a first example of the present disclosure.

FIG. 2 is a circuit diagram of a scanning line driving circuit according to a first example of the present disclosure. In FIG. 2, the scanning line driving circuit includes: a shift resistor unit 10, which is a unit circuit configured to send and receive a shifted signal to and from an adjacent shift resistor unit (not illustrated); and a driver unit 11a configured to drive a scanning line SL. The shift resistor unit 10 includes P-channel transistors TFT10 to TFT16, and the driver unit 11a includes P-channel transistors TFT1 to TFT4.

The transistor TFT1 has a source electrode connected to a power supply VDD and a drain electrode to the scanning line SL. The transistor TFT2 has a source electrode connected to the scanning line SL and a drain electrode to a clock signal line CLK1. The transistor TFT3 has both drain and gate electrodes connected to a gate electrode of the transistor TFT1 (node N3) and has a source electrode supplied with a driving signal of the transistor TFT1 (node N2). The transistor TFT4 has a source electrode connected to the gate electrode of the transistor TFT1, a gate electrode to the source electrode of the transistor TFT3, and a drain electrode to an external control signal line Z_CTRL used for causing the scanning line SL to be in a floating state. The gate electrode of the transistor TFT1 (node N3), a gate electrode of the transistor TFT2 (node N1), and the clock signal line CLK1 are supplied with signals necessary for a shift operation to function as a shift resistor.

The transistor TFT10 has a source electrode connected to the power supply VDD, a drain electrode to the node N2, and a gate electrode supplied with an input signal IN. The transistor TFT11 has a source electrode connected to the power supply VDD, a drain electrode to the node N2, and a gate electrode to a drain electrode of the transistor TFT12. The transistor TFT12 has a source electrode connected to the power supply VDD, the drain electrode to a source electrode of the transistor TFT13 that outputs an output signal OUT, and a gate electrode connected to the node N2. The transistor TFT12 has a function of transferring a high-level output signal OUT to a shift resistor unit in the next state. The transistor TFT13 has the source electrode connected to the drain electrode of the transistor TFT12, a drain electrode to the clock signal line CLK1, and a gate electrode to the node N1. The transistor TFT13 has a function of transferring a low-level output signal OUT to a shift resistor unit in the next stage. The transistor TFT14 has a source electrode connected to the power supply VDD, a drain electrode to the node N1, and a gate electrode to the node N2. The transistor TFT14 has a function of supplying the node N1 with the power supply VDD. The transistor TFT15 has a source electrode connected to the node N1, a drain electrode to the power supply VSS, and a gate electrode supplied with the input signal IN. The transistor TFT16 has both drain and gate electrodes connected to a clock signal line CLK2 and a source electrode to the node N2. The configuration of the single-channel shift resistor unit 10, which is a unit circuit, is not limited to that illustrated in FIG. 2. An arbitrary configuration may be used, as long as the circuit realizes a shift function by using two out-of-phase clock signals supplied through the clock signal lines CLK1 and CL2.

Next, an operation of the driver unit 11a for causing the scanning line to be in a floating state will be described. First, a driver unit that does not have a function of causing the scanning line SL to be in a floating state will be described.

Figure 3:
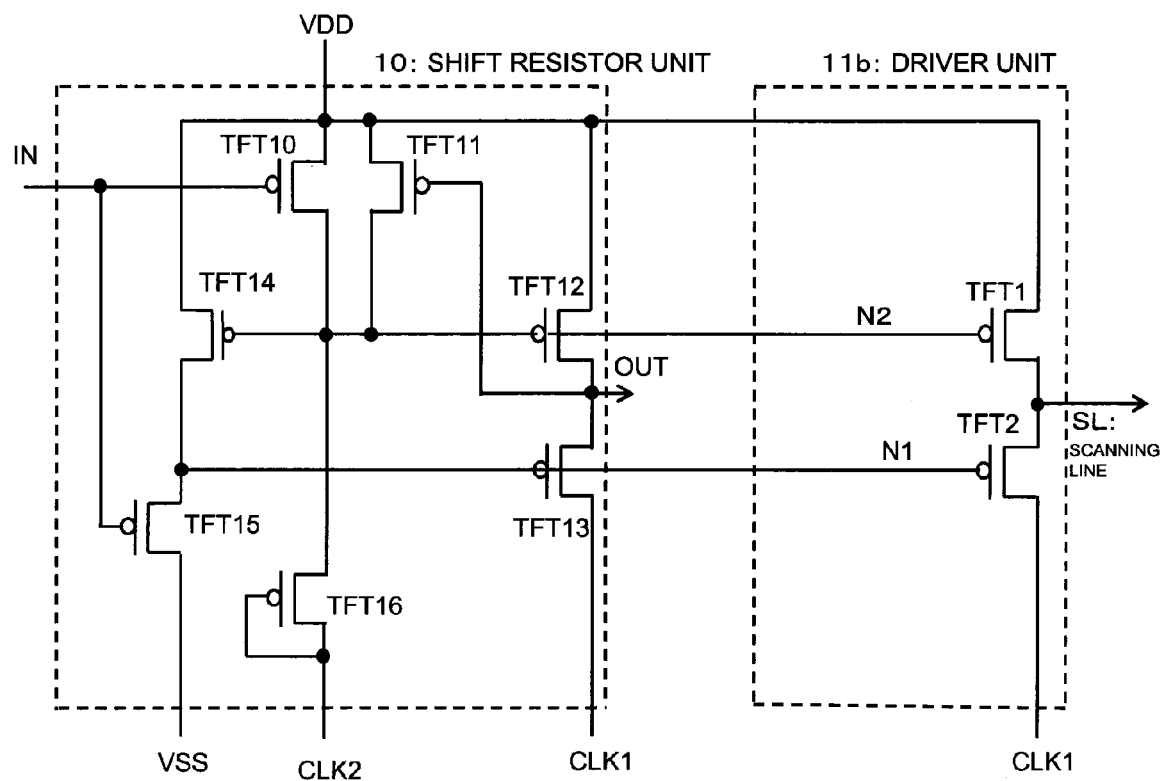
FIG. 3 is a circuit diagram of a scanning line driving circuit including a driver unit that does not have a function of causing scanning lines to be in a floating state.

FIG. 3 is a circuit diagram of a scanning line driving circuit including a driver unit that does not have a function of causing the scanning line SL to be in a floating state. When a driver unit 11b of FIG. 3 is compared with the driver unit 11a in FIG. 2, it can be seen that the driver unit 11b lacks the transistors TFT3 and TFT4, and the nodes N2 and N3 are shorted.

Figure 4A:
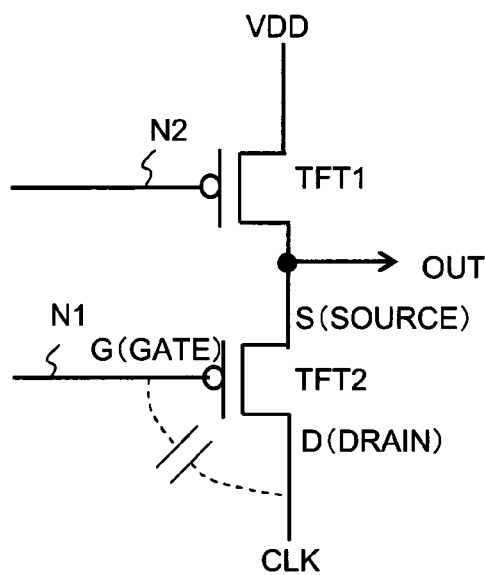
FIG. 4A illustrates a bootstrap effect provided by the scanning line driving circuit according to the first example of the present disclosure.
Figure 4B:
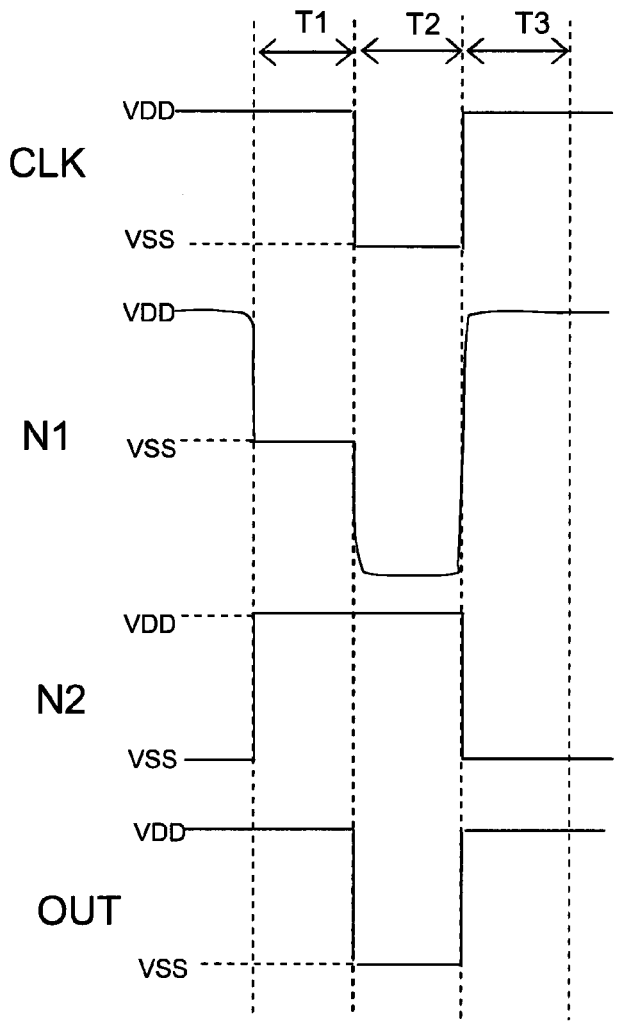
FIG. 4B illustrates timing diagrams at some parts of the scanning line driving circuit.

The driver unit 11b uses a bootstrap effect to output a pulse signal with a maximum (full) amplitude to the scanning line SL. As illustrated in FIG. 4A, drain-gate capacitive coupling is used to output a pulse signal with a full amplitude. While FIG. 4B illustrates a voltage waveform at the node N1 during period T2, the bootstrap effect is an effect of decreasing a gate potential (potential at the node N1) to a potential equal to or less than VSS. By decreasing the gate potential to be equal to or less than VSS, a voltage between the gate and the source of the transistor TFT2 is increased to be a potential equal to or greater than the threshold thereof, and as a result, an output pulse signal having a potential VSS (OUT during period T2 in FIG. 4B) can be outputted.

Thus, during period when a pulse signal is outputted, the gate electrode (node N2) of the transistor TFT1 is in a high-level state (potential equal to or greater than VDD) and the gate electrode (node N1) of the transistor TFT2 is in a low-level state (potential equal to or less than VSS).

Further, as illustrated in FIG. 4B, during period T3 when a pulse is not outputted, the node N2 is in a low-level state and the node N1 is in a high-level state.

Thus, based on the driver unit 11b, since either the transistor TFT1 or TFT2 is turned on during an arbitrary period, the scanning line SL cannot be caused to be in a floating state.

In contrast, the driver unit 11a of FIG. 2 includes the transistors TFT3 and TFT4, and a high-level voltage is supplied to the circuit through the external control signal line Z_CTRL to control the node N3. In this way, the scanning line SL can be caused to be in a floating state.

FIG. 5 illustrates voltage (level) states at the nodes N1, N2, and N3 when the scanning line SL in FIG. 2 outputs a pulse, when the scanning line SL does not output a pulse, and when the scanning line SL is in a floating state. As illustrated in FIG. 5, when the scanning line SL does not output a pulse, since the node N2 is in a low-level state, the transistor TFT4 is turned on. Thus, a voltage at the node N3 can be controlled through the external control signal line Z_CTRL. Namely, if a high-level voltage is applied through the external control signal line Z_CTRL, the node N3 is caused to be in a high-level state. Further, since the node N2 is in a low-level state, the transistor TFT14 is turned on and the node N1 is in a high-level state. Since both the nodes N3 and N1 are caused to be in a high-level state, both the transistors TFT1 and TFT2 can be caused to be in an off-state. Thus, the scanning line SL can be caused to be in a floating state.

Further, since the gate electrode and the drain electrode of the transistor TFT3 are connected (so-called diode-connection structure), even when a high-level voltage is applied to the node N3, the transistor TFT3 will not be caused to be in an on-state. Thus, the node N2 can be maintained in a low-level state, while applying a high-level voltage to the node N3. If the node N2 can be maintained in a low-level state, the transistor TFT14 can be maintained in an on-state, and the node N1 can also be maintained in a high-level state. Namely, a high-level voltage can be applied to the nodes N1 and N3 simultaneously.

In FIG. 3, the node N2 is connected to the gate electrode of the transistor TFT1. However, based on the scanning line driving circuit of the present example, as illustrated in FIG. 2, the node N2 is separated into the nodes N2 and N3 via the diode-connected TFT3, and one of the nodes (node N3) can be maintained in a high-level state and the other node (node N2) can be maintained in a low-level state. In this way, a high-level voltage can be applied to the gates of both the transistors TFT1 and TFT2. Namely, by causing the external control signal line Z_CTRL to be in a high-level state, the scanning line SL can be caused to be in a floating state. When the external control signal line Z_CTRL is in a low-level state, the equivalent circuit is as illustrated in FIG. 3. Since the shift resistor unit 10 directly drives the driver unit 11b, the rise time and the fall time of an output pulse are not extended.

Next, a variation of the first example will be described.

Figure 16:
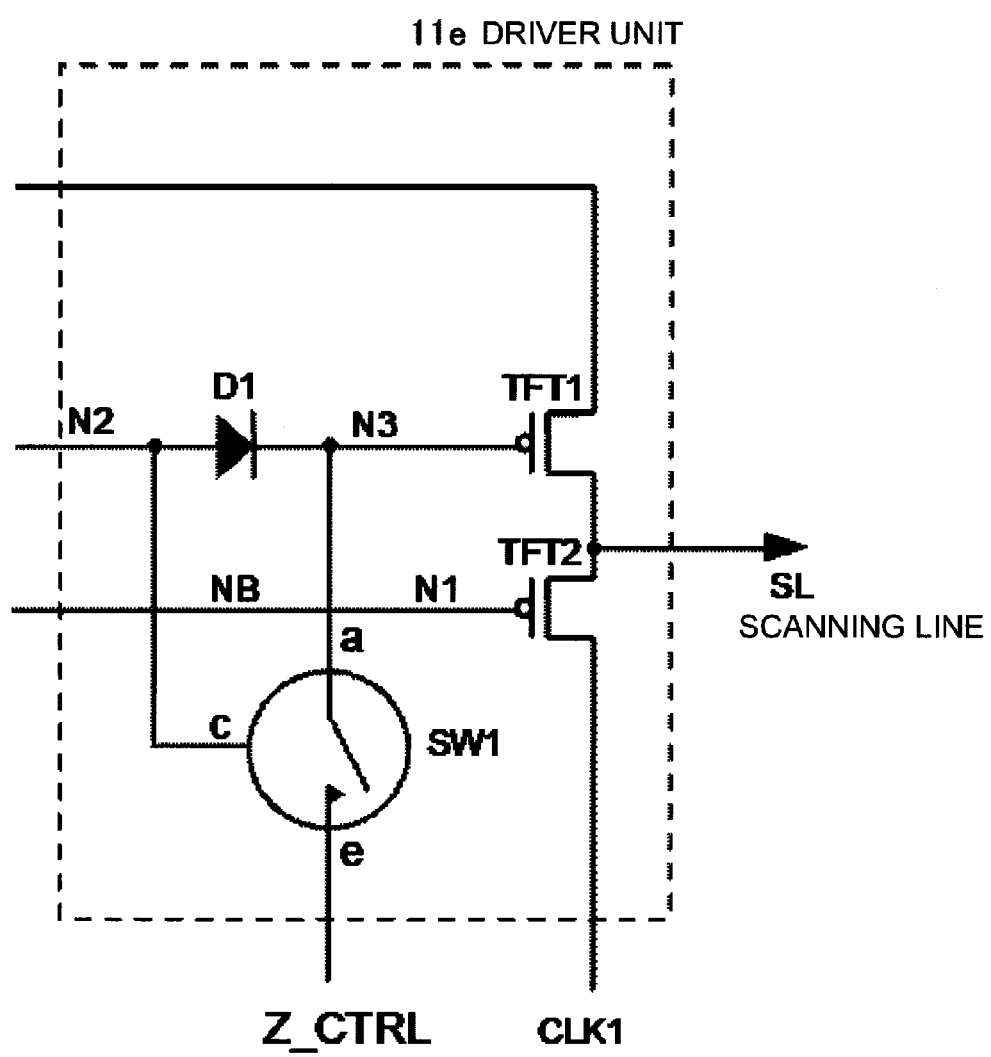
FIG. 16 is a circuit diagram of a variation of the driver unit according to the first example of the present disclosure.

As described above, in terms of the circuit operation, the transistor TFT3 is equivalent to a diode, which is a two-terminal element. Further, the transistor TFT4 is a thin film transistor used as a switch that turns on/off the drain-source potential, and thus, the transistor TFT4 is equivalent to a voltage control switch circuit that controls on/off of the two-terminal element. Therefore, the driver unit 11a illustrated in FIG. 2 can be replaced with a circuit including a diode D1 and a voltage control switch circuit SW1, as illustrated in FIG. 16. Namely, a driver unit 11e of FIG. 16 is equivalent to the driver unit 11a of FIG. 2.

In FIG. 16, the diode D1 is used instead of the transistor TFT3 and has an anode connected to the node N2 and a cathode connected to the node N3. In a semiconductor device including TFTs, the diode D1 can be formed by creating a PN junction in a well and a diffusion layer. Alternatively, by injecting metal, the diode D1 may be formed as a PI Schottky diode. Such diode D1 can be made by employing a process identical to that for manufacturing a P-channel TFT.

The voltage control switch circuit SW1 is used instead of the transistor TFT4. Nodes a and e of the SW1 are controlled to be turned on/off, and a node c is a control voltage input node supplied with a voltage for controlling on/off of the nodes a and e. Since the SW1 is used instead of the transistor TFT4, on/off of the SW1 is controlled by comparing the higher one of the potentials at the nodes a and e with a potential Vc at the node c. More specifically, when a potential Va at the node a is higher than a potential Ve at the node e, on/off of the SW1 is determined based on Vca (=Vc−Va). When Vca<0, the SW1 turns on, and when Vca>0, the SW1 turns off. In contrast, when the potential Ve at the node e is higher than the potential Va at the node a, on/off of the SW1 is determined based on Vce (=Vc−Ve). When Vce<0, the SW1 turns on, and when Vce>0, the SW1 turns off.

Figure 17A:
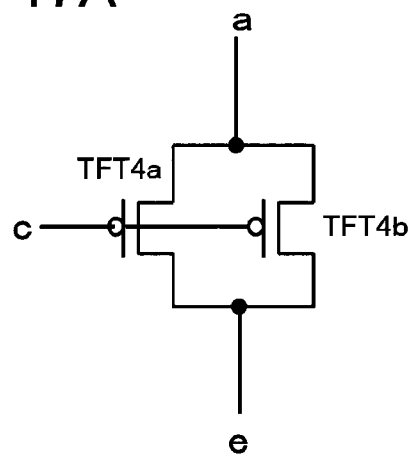
FIGS. 17A to 17D are circuit diagrams of a voltage control switch circuit according to the first example of the present disclosure.

Next, a specific configuration example of the voltage control switch circuit SW1 that operates as described above will be described. FIGS. 17A to 17D illustrate specific examples of the circuit diagram of the voltage control switch circuit SW1. As illustrated in FIG. 17A, the voltage control switch circuit SW1 may include P-channel transistors TFT4a and TFT4b corresponding to the TFT4 of FIG. 2 and the sources, drains, and gates of both the TFT4a and the TFT4b may be connected in parallel.

Figure 17B:
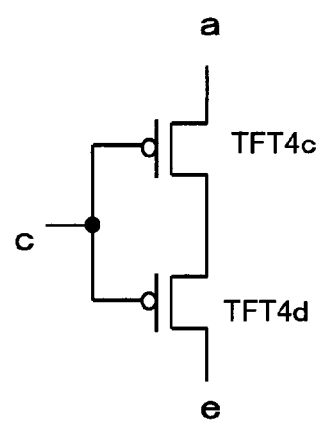

Alternatively, as illustrated in FIG. 17B, the voltage control switch circuit SW1 may include P-channel TFT4c and TFT4d corresponding to the TFT4 of FIG. 2. The TFT4c and TFT4d may be connected in series and the gates of both the TFT4c and TFT4d may be connected to the node c.

Figure 17C:
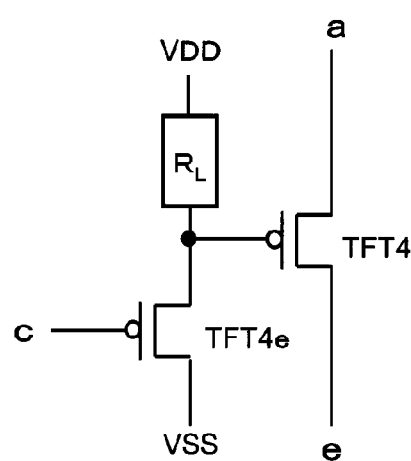

Further alternatively, as illustrated in FIG. 17C, the voltage control switch circuit SW1 may include the TFT4 of FIG. 2 and a P-channel transistor TFT4e that drives the TFT4 of FIG. 2. The TFT4e may be a source follower circuit having a gate connected to the node c and a source connected to a load $R_L$ and the gate of the TFT4. The load $R_L$ may be formed by a constant current source using a diffusion layer resistor or a P-channel TFT.

Figure 17D:
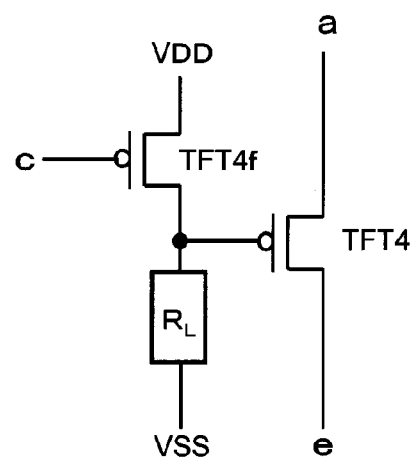

Further alternatively, as illustrated in FIG. 17D, the voltage control switch circuit SW1 may include the TFT4 of FIG. 2 and a P-channel transistor TFT4f that drives the TFT4 of FIG. 2. The TFT4f may be a source-grounded amplifier having a gate connected to the node c and a drain connected to the load $R_L$ and the gate of the TFT4.

Next, specific operation examples will be described with reference to FIGS. 5 and 16. As illustrated in FIG. 5, when a pulse is not supplied, a high level is outputted to the scanning line SL. In this state, the external control signal line Z_CTRL is at a low level. As illustrated in FIG. 5, the nodes N1, N2, and N3 are at high, low, and low levels, respectively.

In this state, if the external control signal line Z_CTRL is sufficiently quickly caused to be at a high level, the nodes a and e are caused to be at low and high levels, respectively. Thus, on/off of the SW1 is controlled based on the potential difference between the node e, which is higher than the node a, and the node c. Since the potential difference Vce between the node c and the node e indicates a negative value, the SW1 turns on. As a result, the node N3 is charged to a high level via the voltage control switch circuit SW1 and caused to be in a floating state as illustrated in FIG. 5. Since both the nodes N1 and N3 are caused to be at a high level, both the transistors TFT1 and TFT2 are caused to be in an off-state. Thus, the scanning line SL is caused to be in a floating state.

EXAMPLE 2

FIG. 6 is a circuit diagram of a scanning line driving circuit according to a second example of the present disclosure. In FIG. 6, elements identical to those in FIG. 2 are denoted by identical reference characters, and the descriptions thereof are omitted. When a driver unit 11c in FIG. 6 is compared with the driver unit 11a of FIG. 2, it can be seen that a P-channel transistor TFT5 is added to the driver unit 11c. The transistor TFT5 has a drain electrode connected to the gate electrode of the transistor TFT1 (node N3), a gate electrode to the gate electrode of the transistor TFT2 (node N1), and a source electrode to the power supply VDD. With this addition of the transistor TFT5, the circuit operates as follows:

Based on the scanning line driving circuit of FIG. 6, during a pulse input period (period T1 in FIG. 7) and during a pulse output period (period T2 in FIG. 7), a potential at the node N1 is caused to be at a low level and a potential at the node N2 is caused to be at a high level (VDD). A potential at the node N3 is increased to be a high level as the potential at the node N2 is charged to be a high level. However, when charged to a value below VDD by a threshold of the TFT (VDD−|Vth|), the potential increase is stopped. This is because since the drain and gate electrodes of the transistor TFT3 are connected, the potential at the gate electrode is increased as the potential at the drain electrode increases.

Figure 7:
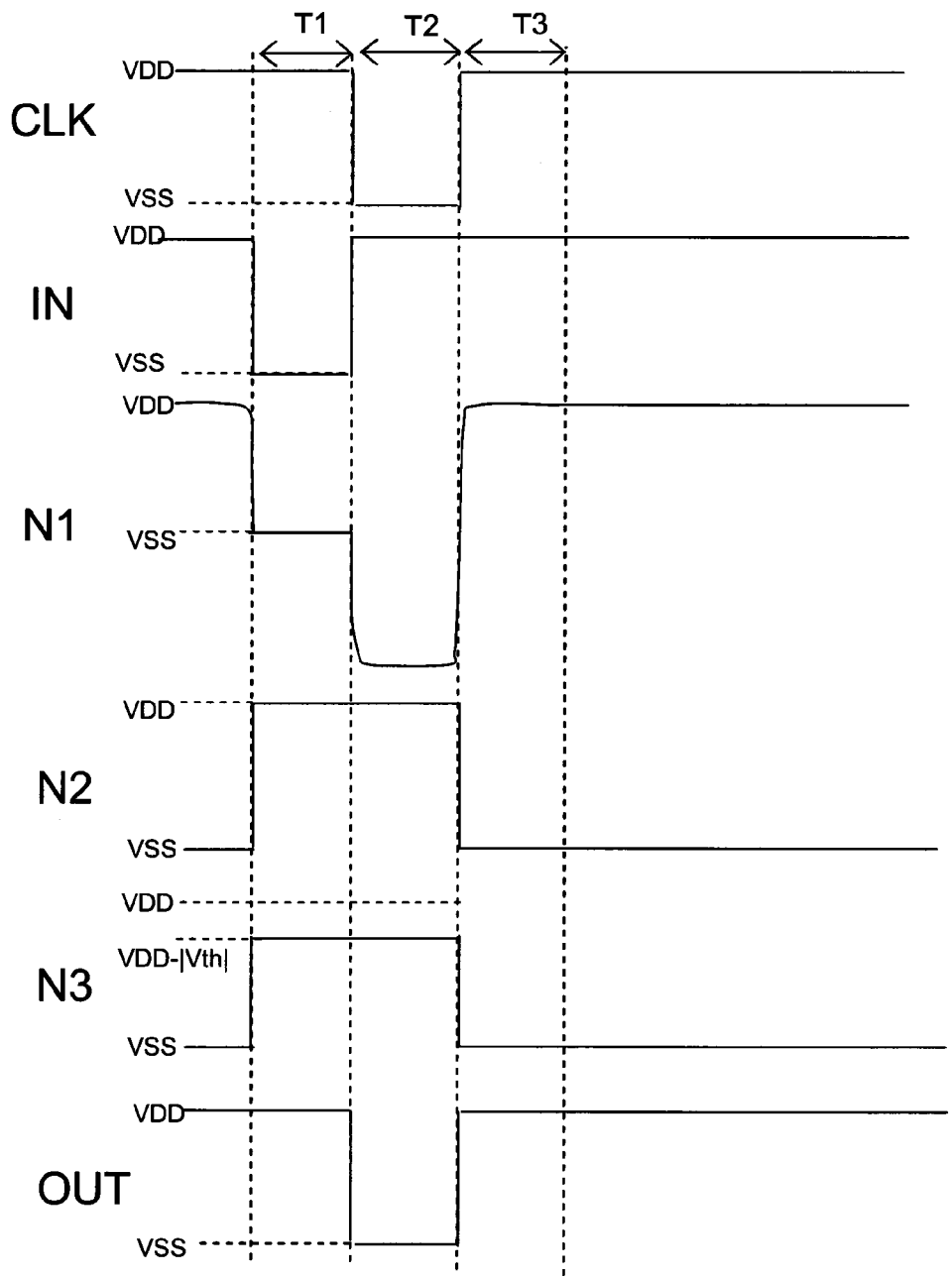
FIG. 7 illustrates timing diagrams at some parts of the scanning line driving circuit according to the second example of the present disclosure.

FIG. 7 illustrates a timing diagram of the scanning line driving circuit of FIG. 6. As illustrated in FIG. 7, if the potential of the node N3 is increased only to the VDD−|Vth| level, a potential at the gate electrode of the transistor TFT1 is also below VDD by an amount of the threshold value thereof. Thus, during the pulse input period (period T1) and the pulse output period (period T2), the transistor TFT1 is in an on-state. Further, during the pulse output period (period T2), a voltage at the gate electrode of the transistor TFT2 is also equal to or less than the threshold thereof because of the bootstrap effect, and as a result, the transistor TFT2 is also in an on-state. Consequently, during period T2, a current passes through the transistors TFT1 and TFT2 from the power supply VDD to the power supply VSS (hereinafter referred to as a pass-through current), resulting in an increase of power consumption.

In order to prevent a flow of the pass-through current, the potential at the node N3 needs to be increased to VDD during a pulse output period, and the transistor TFT1 needs to be completely in an off-state. More specifically, by arranging the transistor TFT5 having the source electrode connected to the power supply voltage VDD, the drain electrode to the node N3, and the gate electrode to the node N1, the potential at the node N3 is increased to VDD during a pulse output period.

The scanning line driving circuit of the present example has a function of causing the scanning line to be in a floating state, prevents a flow of the pass-through current, and realizes lower power consumption.

EXAMPLE 3

Figure 8:
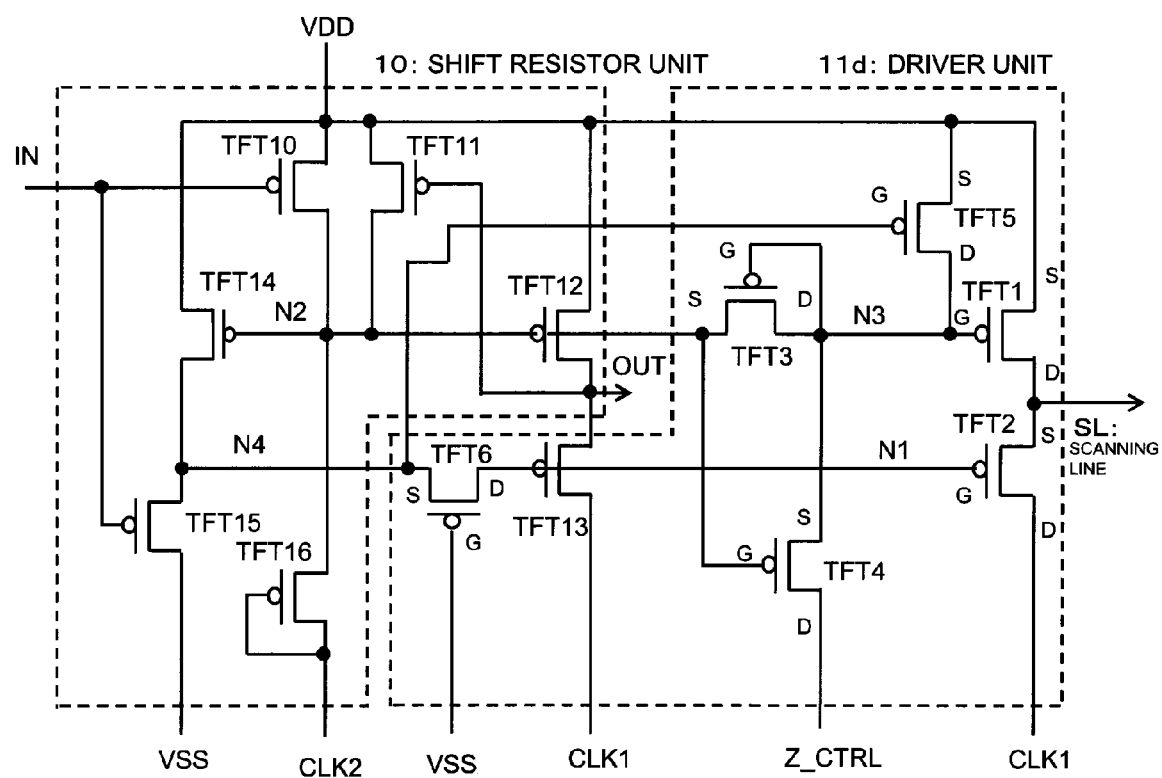
FIG. 8 is a circuit diagram of a scanning line driving circuit according to a third example of the present disclosure.

FIG. 8 is a circuit diagram of a scanning line driving circuit according to a third example of the present disclosure. In FIG. 8, elements identical to those in FIG. 6 are denoted by identical reference characters, and the descriptions thereof are omitted. When compared with the driver unit 11c of FIG. 6, a driver unit 11d of FIG. 8 includes a P-channel transistor TFT6 inserted between a node connected to the drain electrode of the transistor TFT14, the source electrode of the transistor TFT15, and the gate electrode of the transistor TFT5 and a node connected to the gate electrodes of the transistors TFT2 and TFT13. The transistor TFT6 has a drain electrode connected to the gate electrode of the transistor TFT2 (node N1), a gate electrode to the power supply VSS, and a source electrode to the gate electrode of the transistor TFT5 (node N4). In FIG. 8, while the TFT13 is illustrated as being included in the driver unit 11d for convenience of illustration, the TFT13 is actually included in the shift resistor unit 10.

Based on the driver unit 11d of FIG. 8, as in the driver unit 11c of FIG. 6, the potential at the node N3 is increased to VDD by the transistor TFT5 during a pulse output period, and a flow of the pass-through current is prevented. Further, based on a driver unit 11d of FIG. 11, a voltage applied to the gate electrode of the transistor TFT5 is higher, compared with the driver unit 11c of FIG. 6. Namely, the voltage stress applied to the gate electrode of TFT5 is lower. The reasons will be described below.

Based on the driver unit 11c of FIG. 6, the voltage at the node N1 is decreased to be equal to or less than VSS by the bootstrap effect during a pulse output period. This voltage is applied to the gate electrode of the transistor TFT5, the transistor TFT5 is caused to be in an on-state, and the potential at the node N3 is increased to VDD.

Figure 9:
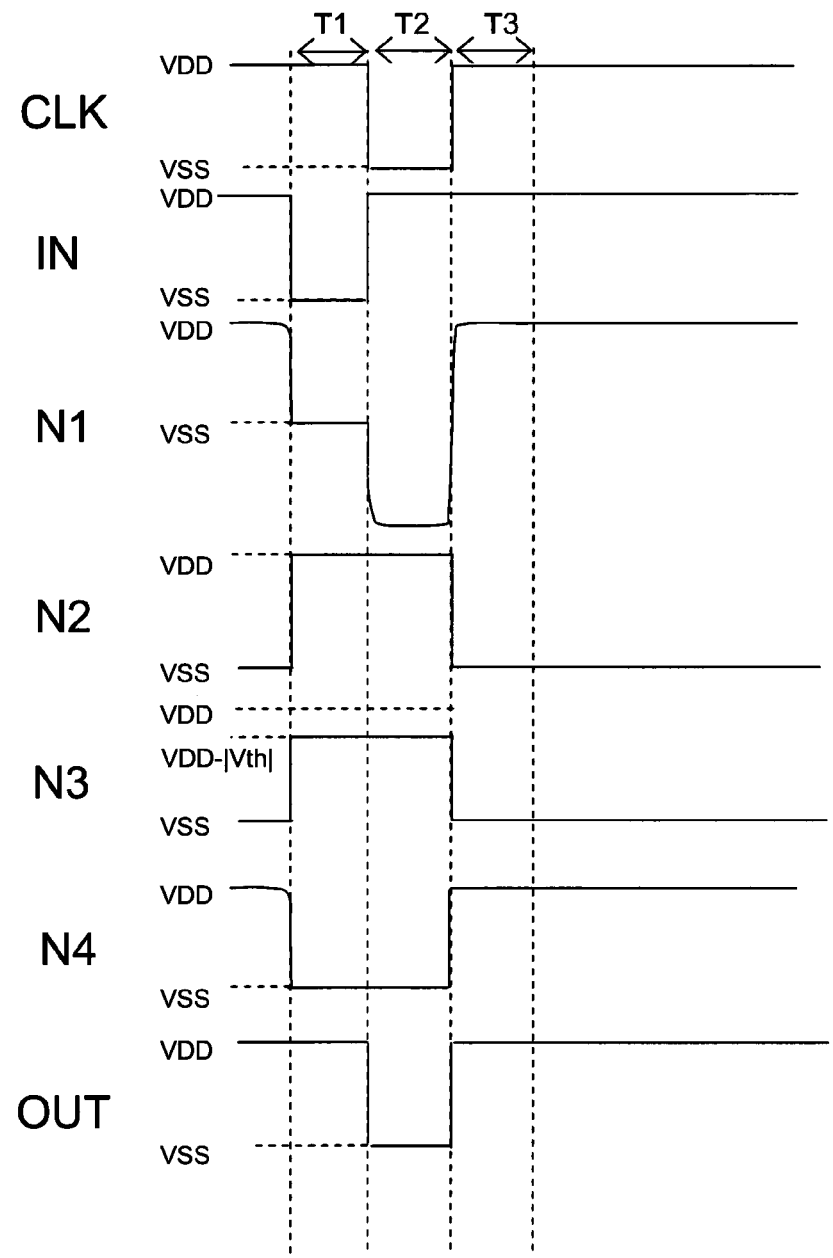
FIG. 9 illustrates timing diagrams at some parts of the scanning line driving circuit according to the third example of the present disclosure.

In contrast, based on the driver unit 11d of FIG. 8, since the transistor TFT6 is arranged (interposed), the node N1 connected to the gate electrode of the transistor TFT2 is separated into nodes N1 and N4. By separating the node N1 in this way, when the voltage at the node N1 is decreased to be equal to or less than VSS by the bootstrap effect, the transistor TFT6 is caused to be in an off-state, and as illustrated in FIG. 9, a voltage at the node N4 will not be decreased to be a potential less than VSS.

Based on the driver unit 11d of FIG. 8, the voltage at the node N4 is applied to the gate electrode of the transistor TFT5, and a voltage decreased by the bootstrap effect to be below VSS is not applied to the gate electrode of the transistor TFT5. Thus, a higher voltage can be applied to the gate electrode. Namely, the driver unit 11d is advantageous in reliability.

Figure 10:
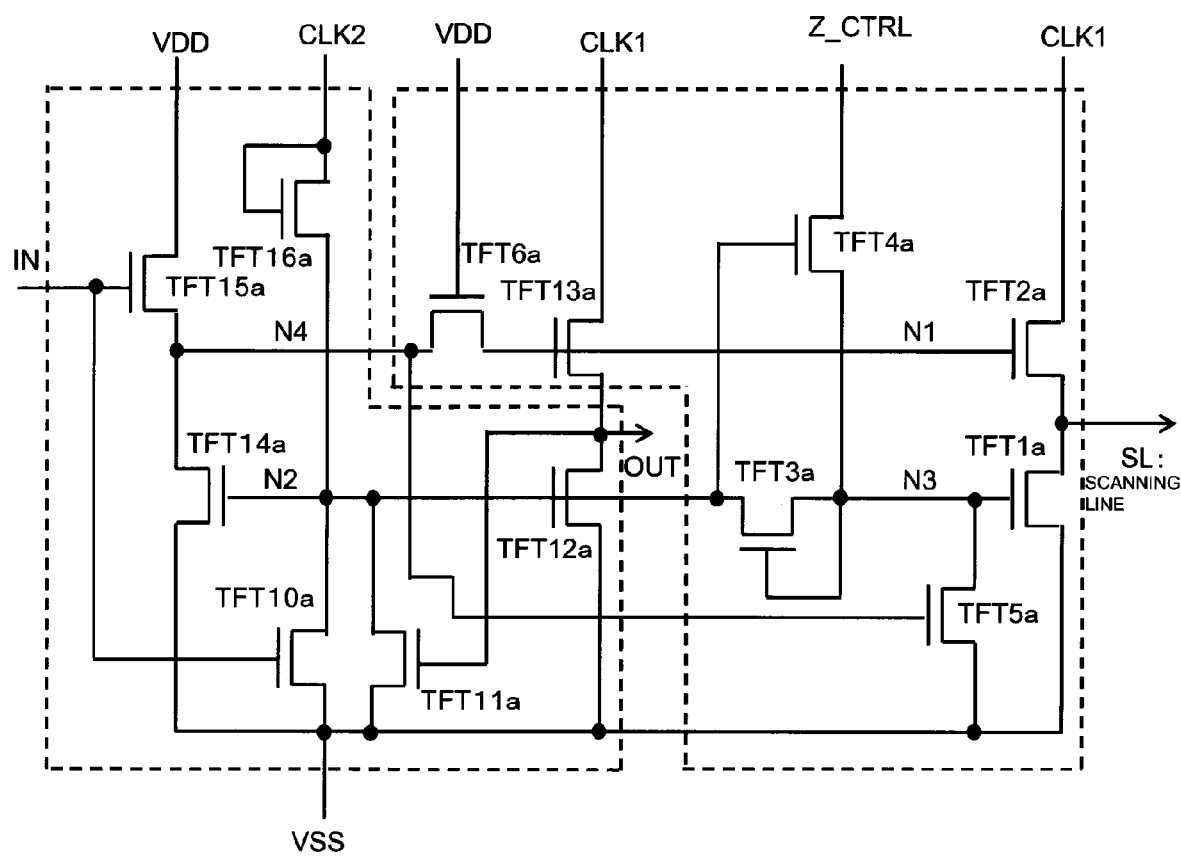
FIG. 10 is another circuit diagram of the scanning line driving circuit according to the third example of the present disclosure.

While each of the scanning line driving circuits described in examples 1, 2, and 3 is formed by only P-channel TFTs, the circuit may be formed by only N-channel TFTs. For example, while the shift resistor unit circuit of FIG. 8 is formed by only P-channel TFTs and achieves lower power consumption and a lower withstand voltage, even if the circuit is formed by only N-channel TFTs as illustrated in FIG. 10, a circuit having the same characteristics can be realized. By simply taking into consideration that a potential at each node of the circuit formed by only N-channel TFTs and a potential at each node of the circuit formed by only P-channel TFTs have an inversion relationship with each other, the operation of the scanning line driving circuit formed by only N-channel TFTs can be described in the same way as described above.

Thus, the scanning line driving circuits described in examples 1, 2, and 3 provide the following advantageous effects:

(1) A shift resistor that can cause a scanning line to be in a floating state, without deterioration of image quality such as deterioration of display contrast, can be provided. Since no switching TFT needs to be arranged on the scanning line, load resistance is not increased, and consequently, the fall or rise of an output pulse will not be delayed.

(2) A highly reliable shift resistor that can cause a scanning line to be in a floating state, without characteristic degradation such as threshold changes, can be provided. Based on a conventional shift resistor, a switching TFT is arranged on a scanning line, and this switching TFT is always maintained in an on-state, except for a short period when the scanning line is caused to be in a floating state. However, since current stress is applied to the switching TFT in this state, the switching TFT is degraded. As a result, the TFT characteristics such as the threshold thereof are changed. Thus, display image quality such as contrast of the liquid crystal display is decreased. According to the present disclosure, since no switching TFTs are arranged on the scanning lines, no TFTs are placed in a certain state where current stress is applied. Thus, the TFTs used in the circuit are less subjected to current stress.

(3) Since the shift resistor circuit that can cause a scanning line to be in a floating state is formed by single-channel TFTs, the number of manufacturing processes can be reduced, compared with when formed as a CMOS circuit.

An example where the scanning line driving circuit of example 1, 2, or 3 is applied to a display device will be hereinafter described.

EXAMPLE 4

Figure 11:
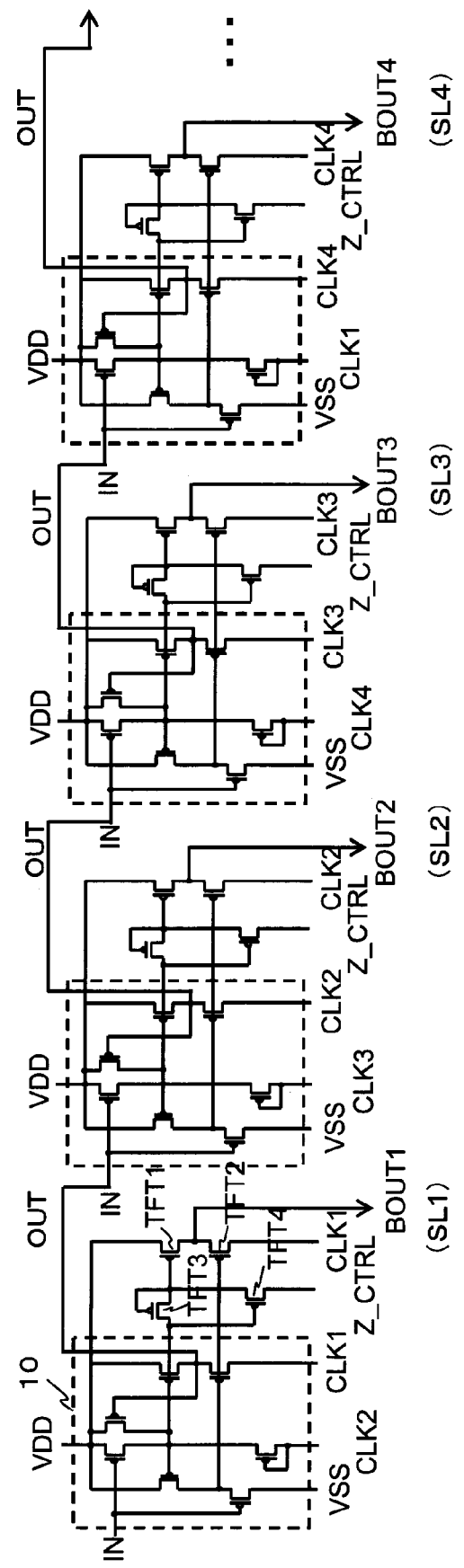
FIG. 11 is a circuit diagram of a scanning line driving circuit according to a fourth example of the present disclosure.

FIG. 11 is a circuit diagram of a scanning line driving circuit according to a fourth example of the present disclosure. A plurality of the scanning line driving circuits of example 1, 2, or 3 may be connected in a cascaded fashion, and FIG. 11 illustrates an example where a plurality of the scanning line driving circuits of example 1 are connected in cascade. Each of the shift resistor units 10 has its IN connected to the OUT of the shift resistor unit 10 in the next stage, and each shift resistor unit 10 is connected to appropriate clock signal lines among clock signals CLK1 to CLK4. Between two adjacent stages, the phases of the supplied clock signals are shifted by an amount of a pulse width. The clock signals CLK1 to CLK4 sequentially shift a signal IN inputted to the initial stage. Further, the shift resistor units 10 supply the scanning lines SL1 to SL4 with the driving signals BOUT1 to BOUT4 via the driver units 11a, respectively.

Figure 12:
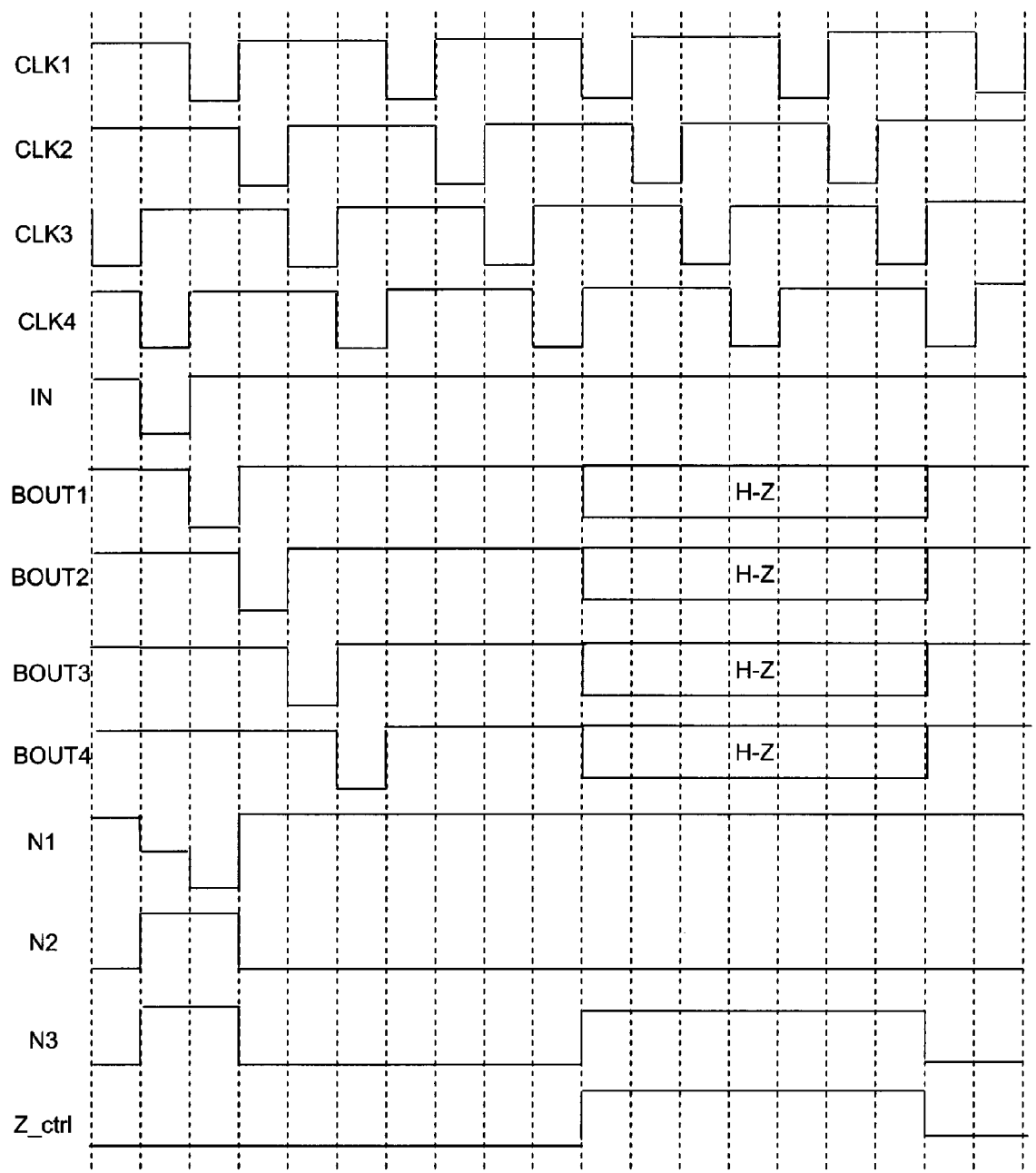
FIG. 12 illustrates timing diagrams at some parts of the scanning line driving circuit according to the fourth example of the present disclosure.

FIG. 12 is a timing diagram illustrating an operation of the scanning line driving circuit according to the fourth example of the present disclosure. The scanning line driving circuits use the clock signals CLK1 to CLK4, the phases of two adjacent clock signals being shifted by a pulse width, to sequentially shift the signal IN inputted to the shift resistor unit 10 in the initial stage and to output the shifted signals as the driving signals BOUT1 to BOUT4. When the external control signal line Z_CTRL is caused to be at a high level, the nodes N1 and N3 are caused to be at a high level, and the driving signals BOUT1 to BOUT4 are caused to be in a floating state (Hi-Z).

While the scanning line driving circuits illustrated in FIG. 11 are driven by four clock signals CLK1 to CLK4, the number of these drive clock signals may be three or two.

EXAMPLE 5

Figure 13:
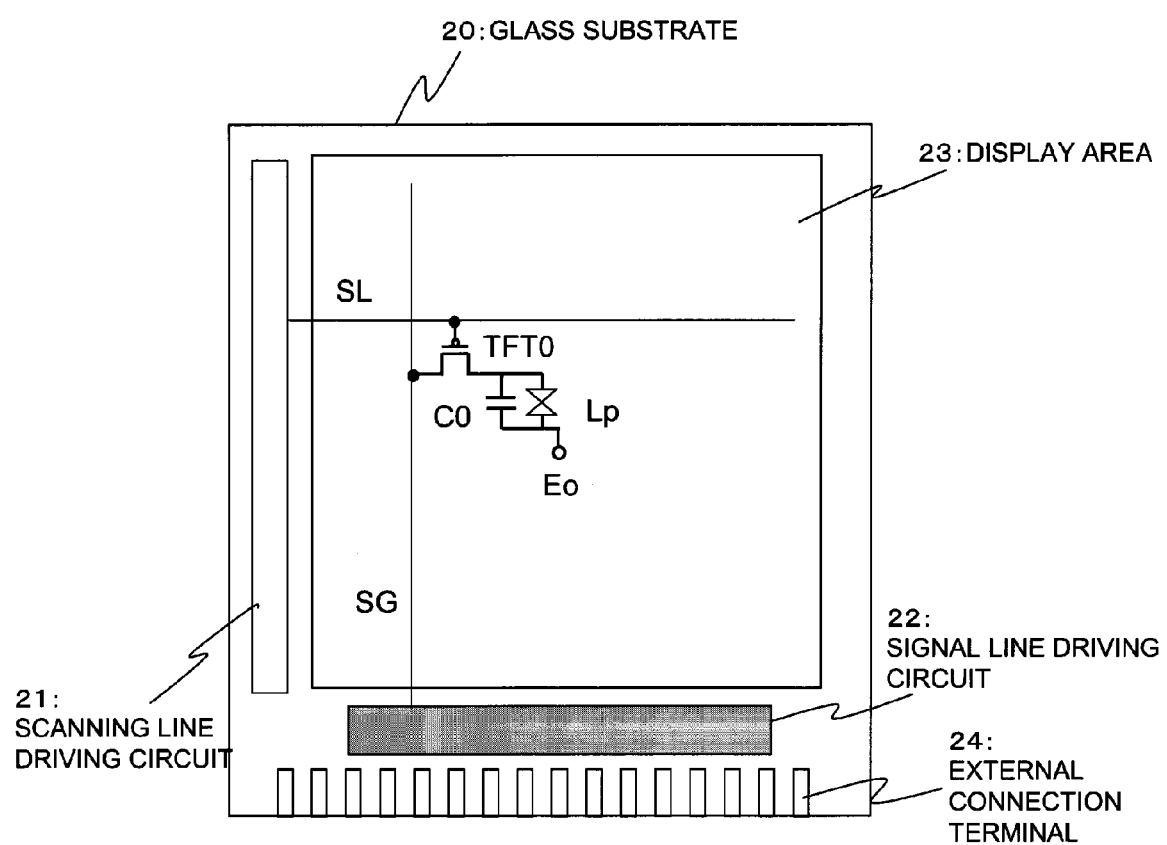
FIG. 13 illustrates a configuration of a display device according to a fifth example of the present disclosure.

FIG. 13 illustrates a configuration of a display device according to a fifth example of the present disclosure. In FIG. 13, a display device includes a glass substrate 20 on which a scanning line driving circuit 21, a signal line driving circuit 22, a display area 23 as a pixel area, external connection terminals 24 connected to the scanning line driving circuit 21 and the signal line driving circuit 22 are arranged. The scanning line driving circuit 21 is one as described in example 4, and each pixel in the display area 23 is driven by a scanning signal (driving signal) supplied through a scanning line SL extending in the horizontal direction. The signal line driving circuit 22 supplies an image signal to each pixel in the display area 23 through a signal line SG extending in the vertical direction.

Figure 14:
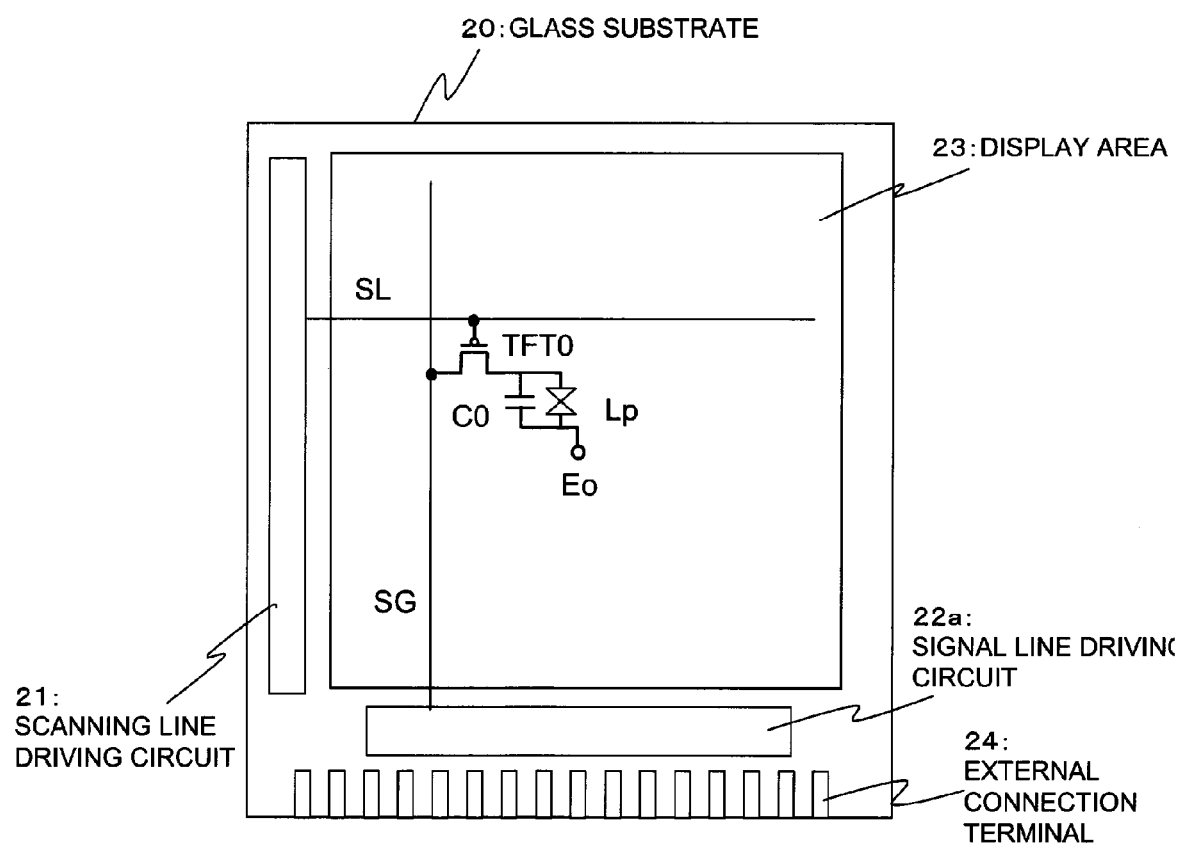
FIG. 14 illustrates another configuration of the display device according to the fifth example of the present disclosure.

The signal line driving circuit 22 may be mounted based on a chip-on-glass (COG) technique. Alternatively, TFTs may be integrated on the glass substrate, such as a signal line driving circuit 22a illustrated in FIG. 14.

EXAMPLE 6

Figure 15:
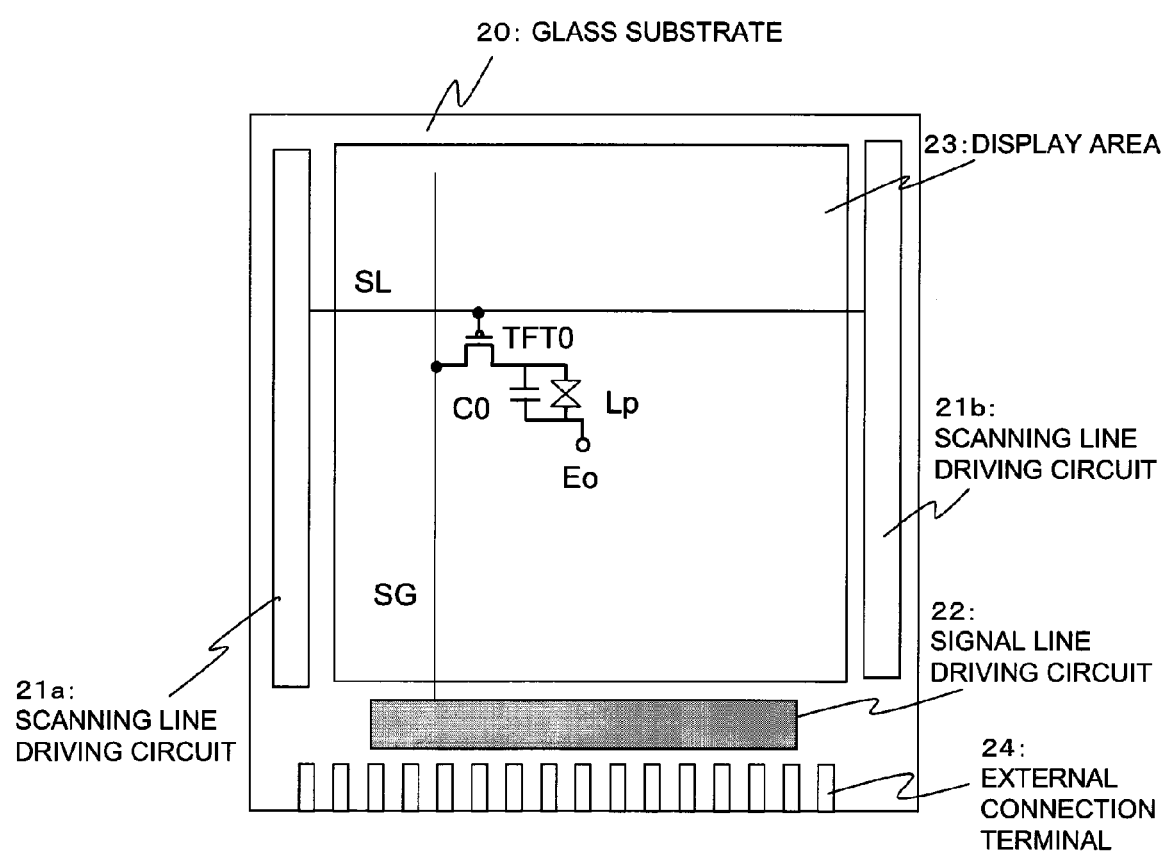
FIG. 15 illustrates a configuration of a display device according to a sixth example of the present disclosure.

FIG. 15 illustrates a configuration of a display device according to a sixth example of the present disclosure. In FIG. 15, elements identical to those in FIG. 13 are denoted by identical reference characters, and the descriptions thereof are omitted. Based on the display device of the present example, as illustrated in FIG. 15, two scanning line driving circuits 21a and 21b are arranged opposite to each other on both sides (left and right sides) of the display area 23. Since a single scanning line SL is connected to both of the circuits 21a and 21b, the scanning direction of the display unit can be changed.

For example, a left-hand scanning line driving circuit 21a may execute a scanning operation from the bottom, and a right-hand scanning line driving circuit 21b may execute a scanning operation from the top. Thus, by using the external control signal line Z_CTRL (not illustrated) and switching the scanning line driving circuit to be caused to have high impedance, the scanning direction of the display device can be changed. For example, by causing an output from the left-hand scanning line driving circuit 21a to be in a floating state, the scanning line SL can be scanned from the top by an output from the right-hand scanning line driving circuit 21b. Alternatively, by causing an output from the right-hand scanning line driving circuit 21b to be in a floating state, the scanning line SL can be scanned from the bottom by an output from the left-hand scanning line driving circuit 21a.

The entire disclosure of the above Patent Documents and the like are incorporated herein by reference thereto. Modifications and adjustments of the exemplary embodiments and examples are possible within the scope of the overall disclosure (including claims) of the present disclosure and based on the basic technical concept of the present disclosure. Various combinations and selections of various disclosed elements are possible within the scope of the claims of the present disclosure. That is, the present disclosure of course includes various variations and modifications that could be made by those skilled in the art according to the overall disclosure including the claims and the technical concept.

What is claimed is:

1. A scanning line driving circuit comprising:
   a first transistor having a source electrode connected to a power supply and a drain electrode connected to a scanning line;
   a second transistor having a source electrode connected to the scanning line and a drain electrode connected to a clock signal line and having a conductivity type identical to that of the first transistor;
   a third transistor having both drain and gate electrodes connected to a gate electrode of the first transistor and a source electrode supplied with a driving signal of the first transistor; and a fourth transistor having a source electrode connected to the gate electrode of the first transistor, a gate electrode connected to the source electrode of the third transistor, and a drain electrode connected to an external control signal line used for causing the scanning line in a floating state, wherein each of the first, second, third, and fourth transistors are of an identical conductivity type, and wherein the gate electrode of the first transistor, a gate electrode of the second transistor, and the clock signal line are supplied with signals necessary for a shift operation to function as a shift resistor.

2. The scanning line driving circuit according to claim 1, further comprising:

a fifth transistor having a conductivity type identical to that of the first to fourth transistors and having a drain electrode connected to the gate electrode of the first transistor, a gate electrode connected to the gate electrode of the second transistor, and a source electrode connected to the power supply.

3. The scanning line driving circuit according to claim 2, further comprising: a sixth transistor having a conductivity type identical to that of the first to fourth transistors and having a drain electrode connected to the gate electrode of the second transistor, a gate electrode connected to a power supply different from said power supply, and a source electrode connected to the gate electrode of the fifth transistor, wherein the gate electrode of the fifth transistor is connected to the gate electrode of the second transistor via the sixth transistor.

4. A display device comprising the scanning line driving circuit according to claim 1.

5. A display device comprising a pair of the scanning line driving circuits according to claim 1 connected to the scanning line.

6. The display device according to claim 5, wherein the pair of the scanning line driving circuits is arranged to sandwich a display area in which the scanning line is arranged, and the external control signal line in one of the pair of the scanning line driving circuits is activated.

7. The display device according to claim 6, wherein a scanning direction is inverted by controlling the external control signal line.

8. The scanning line driving circuit according to claim 1, wherein bias is applied so that the first and second transistors are simultaneously caused to be in an off-state.

* * * * *